United States Patent
Yew et al.

(10) Patent No.: US 8,901,732 B2
(45) Date of Patent: Dec. 2, 2014

(54) SEMICONDUCTOR DEVICE PACKAGE AND METHOD

(71) Applicant: Taiwan Semiconductor Manufacturing Company, Ltd., Hsin-Chu (TW)

(72) Inventors: Ming-Chih Yew, Hsin-Chu (TW); Fu-Jen Li, Hsin-Chu (TW); Wen-Yi Lin, New Taipei (TW); Po-Yao Lin, Zhudong Township (TW); Kuo-Chuan Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/796,610

(22) Filed: Mar. 12, 2013

(65) Prior Publication Data
US 2014/0264815 A1    Sep. 18, 2014

(51) Int. Cl.
| | |
|---|---|
| H01L 23/04 | (2006.01) |
| H01L 21/48 | (2006.01) |
| H01L 23/36 | (2006.01) |
| H01L 21/56 | (2006.01) |
| H01L 21/50 | (2006.01) |
| H01L 23/373 | (2006.01) |
| H01L 23/367 | (2006.01) |

(52) U.S. Cl.
CPC ............ H01L 23/04 (2013.01); H01L 21/4871 (2013.01); H01L 21/563 (2013.01); H01L 23/36 (2013.01); H01L 21/50 (2013.01); H01L 23/3736 (2013.01); H01L 23/3672 (2013.01)
USPC ............ 257/706; 257/712; 257/713; 438/112; 438/122; 438/124; 438/127

(58) Field of Classification Search
CPC ... H01L 21/4871; H01L 21/50; H01L 21/563; H01L 23/28; H01L 23/34; H01L 23/36; H01L 23/3672; H01L 23/3736
USPC .......... 257/706, 712, 713; 438/112, 122, 124, 438/127
See application file for complete search history.

(56) References Cited

U.S. PATENT DOCUMENTS

| | | | | |
|---|---|---|---|---|
| 6,486,562 | B1 * | 11/2002 | Kato | 257/778 |
| 2008/0157300 | A1 * | 7/2008 | Chuang et al. | 257/675 |
| 2010/0096747 | A1 * | 4/2010 | Kusano | 257/706 |
| 2010/0230797 | A1 * | 9/2010 | Honda | 257/687 |

* cited by examiner

*Primary Examiner* — Peniel M Gumedzoe
(74) *Attorney, Agent, or Firm* — Slater & Matsil, L.L.P.

(57) ABSTRACT

Various packages and methods are disclosed. A package according to an embodiment includes a substrate, a chip attached to a surface of the substrate with electrical connectors, a molding compound on the surface of the substrate and around the chip, an adhesive on a surface of the chip that is distal from the surface of the substrate, and a lid on the adhesive. In an embodiment, a region between the molding compound and the lid at a corner of the lid is free from the adhesive. In another embodiment, the lid has a recess in a surface of the lid facing the surface of the molding compound.

20 Claims, 11 Drawing Sheets

SEMICONDUCTOR DEVICE PACKAGE AND METHOD

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

However, some FcCSP packages tend to exhibit bending, where warping of the substrate occurs during processing, such as during temperature stress. The bending can cause reliability issues, such as bond breakage of the bumps, delamination of an underfill, and delamination of a passivation layer on the die.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5DIC) structure or a three dimensional IC (3DIC) structure. Although method embodiments may be discussed below as being performed in a particular order, other method embodiments contemplate steps that are performed in any logical order. Further, like reference numbers or indicators refer to like components.

Figure 1:
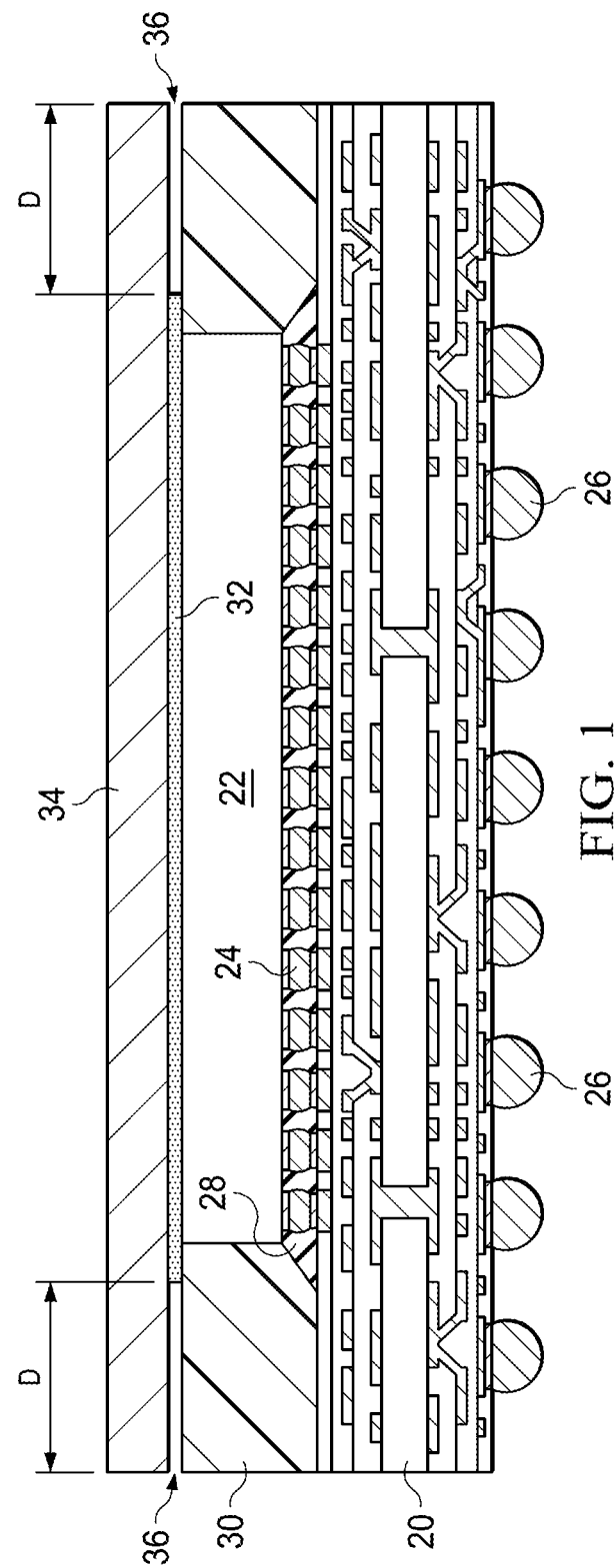
FIG. 1 is a first package according to an embodiment.

FIG. 1 illustrates a first package according to an embodiment. The package comprises a substrate 20 and a chip 22. The chip 22 is attached on a top surface of the substrate 20 by electrical connectors 24 on respective pads of the substrate 20. The substrate 20 in this embodiment is an organic substrate, such as comprising Ajinomoto Build-up Film (ABF), and can be formed by acceptable techniques. The chip 22 can be formed according to acceptable techniques, and embodiments contemplate a chip with any functionality. The electrical connectors 24 in this embodiment are metal posts, such as copper, with a lead free solder, such as a eutectic material such as SnAgCu ("SAC"), formed thereon. The electrical connectors 24 can also be Controlled Collapsible Chip Connection (C4) or other bumps formed by acceptable methods. The chip 22 is attached to the substrate 20 using, for example, a pick-and-place tool, and the electrical connectors 24 are reflowed. An underfill material 28 is between the chip 22 and the top surface of the substrate 20 and around the electrical connectors 24. The underfill material 28 may provide further mechanical coupling and support between the chip 22 and the substrate 20. The underfill material 28 can be a liquid epoxy, deformable gel, silicon rubber, the like, or a combination thereof.

A molding compound 30 surrounds and encapsulates the chip 22. The molding compound 30 may be any acceptable molding compound. After the chip 22 is attached to the substrate 20, the molding compound 30 may be applied using, for example, injection molding, compression molding, or the like, and may be subsequently cured. In this example, the top surface of the molding compound 30 is co-planar with the top surface of the chip 22 such that the top surface of the chip 22 is exposed from the molding compound 30, although in other embodiments the top surface of the molding compound 30 may be above or below the top surface of the chip 22.

The package further comprises a lid 34, which may also be a heat spreader, attached to the top surface of the molding compound 30 and/or the top surface of the chip 22 using an adhesive 32, which may also be a thermal interface material. The lid 34 in this embodiment is planar, although in other embodiments, the lid 34 may be contoured to various contours of a package, such as if the molding compound 30 has a top surface below the top surface of the chip 22. The lid 34 in this embodiment is steel and, in other embodiments, can be copper, stainless steel, the like, or a combination thereof. The adhesive 32 may be a thermally conductive and electrically insulative material, such as an epoxy, like an epoxy mixed with a metal like silver or gold, a "thermal grease," a "white grease," the like, or a combination thereof. The adhesive 32 may be dispensed on the top surfaces of the molding compound 30 and/or the chip 22. The lid 34 may then be placed, using a pick-and-place tool, on the adhesive 32 to attach the lid 34 to the remainder of the package.

The adhesive 32 is not between the lid 34 and the molding compound 30 at periphery portions of the package. Gaps 36 are formed between the lid 34 and the molding compound 30 at these periphery portions. FIG. 1 shows a lateral distance D between a lateral edge of the adhesive 32 from lateral edges of the molding compound 30 and the lid 34. The lateral distance D may be uniform around a periphery of the package or may vary between different locations in the package. In this embodiment, the adhesive 32 covers the top surface of the chip 22 and only a portion of the molding compound 30 proximate the chip 22. FIGS. 2 through 5 illustrate examples of patterns of the adhesive 32 on the lid 34.

FIG. 1 further illustrates electrical connectors 26, such as a ball grid array (BGA), on a bottom surface of the substrate 20 that is opposite the top surface of the substrate 20. The electrical connectors 26 may be lead free solder or the like. The package may be placed on another board, and the electrical connectors 26 may be reflowed to connect the package to the board.

Figure 2:
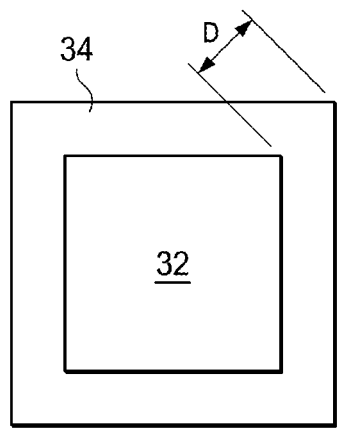
FIGS. 2 through 5 are examples in plan views of patterns of adhesive on a lid according to embodiments.
Figure 3:
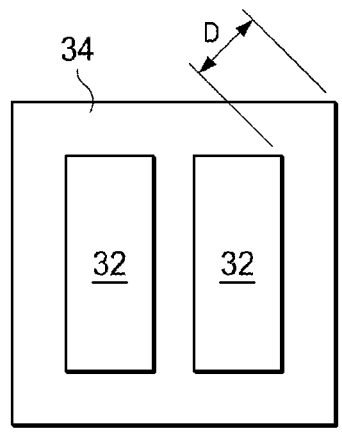
Figure 4:
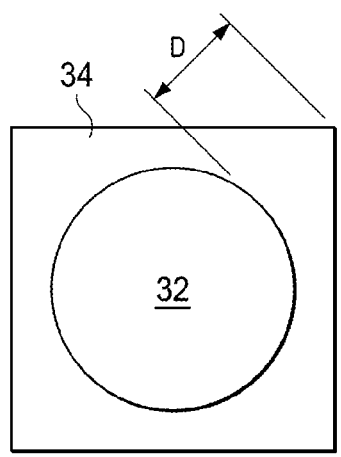
Figure 5:
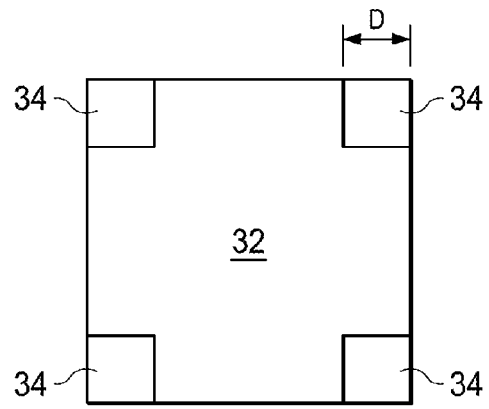

FIGS. 2 through 5 illustrate examples in plan views of patterns of the adhesive 32 on the lid 34. In FIG. 2, a single rectangular pattern (e.g., a square pattern) of the adhesive 32 is on the lid 34. Each corner of the rectangular pattern of the adhesive 32 is a distance D from a respective nearest corner of the lid 34. In FIG. 3, a dual rectangular pattern of the adhesive 32 is on the lid 34. Each corner of the lid 34 is a distance D from a respective nearest corner of the dual rectangular pattern of the adhesive 32. In FIG. 4, a round pattern of the adhesive 32 is on the lid 34. Each corner of the lid 34 is a distance D from a nearest edge of the round pattern of the adhesive 32. In FIG. 5, a concave dodecagon pattern (e.g., a '+'-shaped polygon) of the adhesive 32 is on the lid 34. The adhesive 32 covers the lid 34 except for rectangular (e.g., square) portions at the corners. Each side of the rectangular portions is a distance D. For each pattern of the adhesive 32, the distances discussed between the corners of the adhesive 32 and the lid 34 may be equal or can vary within the package. Other patterns of adhesive 32 may also be used.

The distance D in these embodiments is the minimum distance that an edge of the adhesive 32 may be to a corner of the lid 34. Embodiments contemplate any distances as the minimum distance D, particularly with varying technology sizes. In some embodiments, the minimum distance is at least 5 percent of a distance from an exterior, lateral edge or corner of the top surface of the molding compound 30 to a corresponding exterior, lateral edge or corner of the top surface of the chip 22. In some embodiments, the minimum distance is about 300 μm. The distance D may be greater than the minimum distance in other embodiments.

By not having a full coverage of adhesive 32 in the region between the lid 34 and the molding compound 30, a gap 36, such as an air gap, may be formed in a portion between the lid 34 and the molding compound 30, and/or the molding compound 30 may not be mechanically coupled to the lid 34 in the portion of the region where there is no adhesive 32. The various components and materials used in the package may have different coefficient of thermal expansions (CTEs). Hence, when the package undergoes thermal cycling, the components and materials may expand at different rates. In packages with no gap, such as when there is full coverage of the adhesive, this expansion of components and materials at different rates may lead to significant warpage of the package. In embodiments with gaps 36, warpage may be improved because, for example, the molding compound 30 may expand into the gaps 36 and/or may not be restricted from lateral expansion because there may be little to no mechanical coupling of the molding compound 30 to the lid 34.

Figure 6:
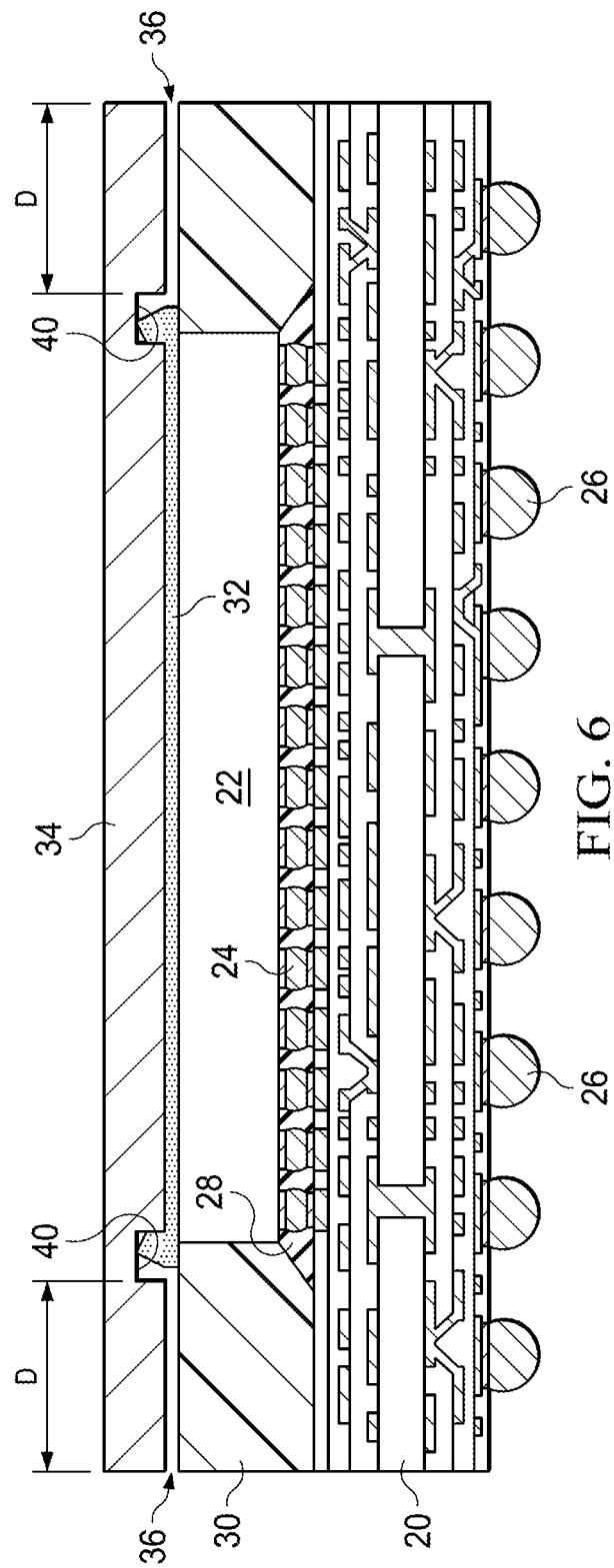
FIG. 6 is a second package according to an embodiment.

FIG. 6 illustrates a second package according to an embodiment. Many of the components of the second package in FIG. 6 are the same as components of the first package in FIG. 1, as identified by like reference numbers. Hence, explicit discussion of those components here is omitted. The lid 34 comprises a recess(es) 40. The recess(es) 40 in the lid 34 is facing the adhesive 32, the molding compound 30, and the chip 22. The recess(es) 40 can be formed in the lid 34 using a mechanical process, such as a punching process; a chemical process, such as an etching process; laser ablation; or the like. When the lid 34 is placed on the adhesive 32, the adhesive 32 may be extruded between the lid 34 and the chip 22 and/or molding compound 30. This extrusion can cause the adhesive 32 to be formed at locations laterally displaced from the original dispensing location of the adhesive 32. For example, a compressive force in a direction perpendicular to the top surface of the chip 22 and/or molding compound 30 used to attach the lid 34 may force the adhesive 32 in a direction perpendicular to the compressive force. In embodiments, the recess(es) 40 may prevent the adhesive 32 from being extruded beyond the recess(es) 40. The recess(es) 40 may allow for a region free from the compressive force, and adhesive 32 may at least partially fill the recess(es) 40. By allowing for such a region free from the compressive force, adhesive 32 may not be extruded beyond the recess(es) 40.

As shown, the adhesive 32 is not between the lid 34 and the molding compound 30 at periphery portions of the package, such as portions laterally between a recess 40 and the package edge. Gaps 36 are formed between the lid 34 and the molding compound 30 at these periphery portions. FIG. 6 shows a lateral distance D between a lateral edge of the recess(es) 40 from the lateral edges of the molding compound 30 and the lid 34. The lateral distance D may be uniform around a periphery of the package or may vary between different locations in the package. In this embodiment, the adhesive 32 covers the top surface of the chip 22 and only a portion of the molding compound 30 proximate the chip 22.

Figure 7:
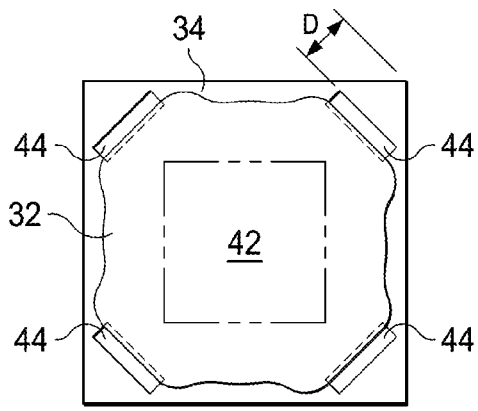
FIGS. 7 through 10 are examples in plan views of patterns of recess(es) in a lid according to embodiments.
Figure 8:
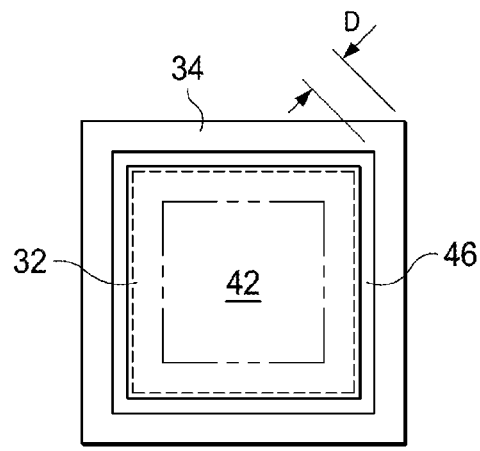
Figure 9:
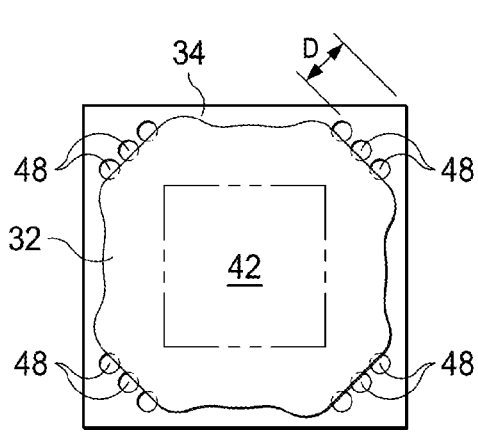
Figure 10:
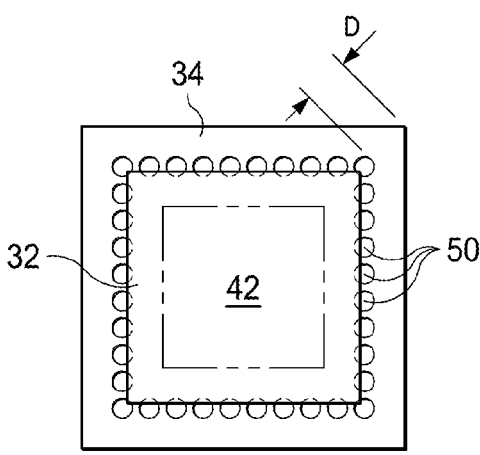

FIGS. 7 through 10 illustrate example patterns of the recess(es) 40 in the lid 34. Each of FIGS. 7 through 10 illustrates the lid 34, the adhesive 32, and a chip area 42 (identified by dashed lines forming a rectangular area), e.g., an area of the top surface of the chip 22 that is exposed through the molding compound 30 in the foregoing figures. In FIG. 7, the lid 34 has four trench recesses 44. Each trench recess 44 is between respective corners of the lid 34 and the chip area 42 and is disposed at approximately 45° angles with the corresponding sides of the lid 34. In FIG. 8, the lid 34 has a trench recess 46 circumscribing the chip area 42. In FIG. 9, the lid 34 has three discreet recesses 48 between respective corners of the lid 34 and the chip area 42 that are aligned at approximately 45° angles with the corresponding sides of the lid 34. In FIG. 10, the lid 34 has discreet recesses 50 circumscribing the chip area 42. In FIGS. 7 through 10, each of the respective recesses 44, 46, 48, and 50 are at least a minimum distance D from a corner of the lid 34. The minimum distance D can be any logical amount for a particular application. In some embodiments, the minimum distance is at least 5 percent of a distance from an exterior, lateral edge or corner of the top surface of the molding compound 30 to a corresponding exterior, lateral edge or corner of the top surface of the chip 22. Specific embodiments contemplate a minimum distance of 1 mm, or more specifically, 300 μm.

Figure 11:
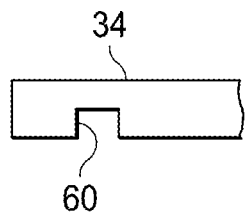
FIGS. 11 through 13 are example cross-sections of a recess in a lid according to embodiments.
Figure 12:
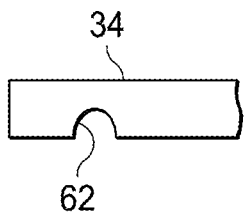
Figure 13:
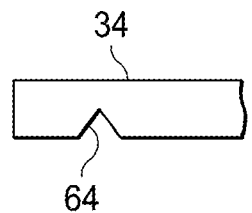

FIGS. 11 through 13 illustrate example cross-sections of the recess(es) 40 in the lid 34. In FIG. 11, cross-section 60 of a recess 40 is substantially rectangular. In FIG. 12, cross-section 62 of a recess 40 is substantially semioval. In FIG. 13, cross-section 64 of a recess 40 is substantially triangular. Other embodiments contemplate various other cross-sectional shapes for a recess 40.

Figure 14:
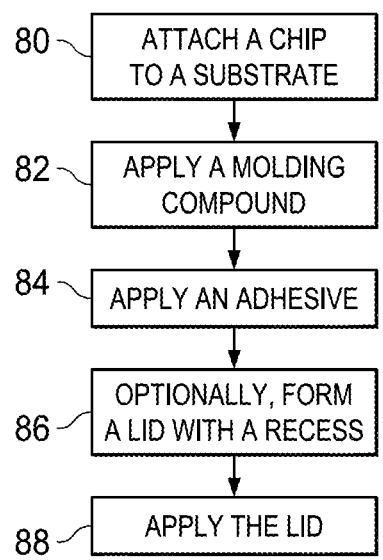
FIG. 14 is a process flow according to an embodiment.

FIG. 14 is a process flow to produce a package according to an embodiment. In step 80, a chip is attached to a substrate, such as by using a pick-and-place tool to place the chip on the substrate and reflowing electrical connectors 24 between the chip 22 and the substrate 20 as previously discussed. In step 82, a molding compound, such as the molding compound 30, is applied around the periphery of the chip and on the top surface of the substrate, such as illustrated in FIGS. 1 and 6, using injection molding, compression molding, or the like and curing the molding compound, for example. In step 84, an adhesive, such as adhesive 32, is applied, for example, by dispensing the adhesive on the chip and/or molding compound. The pattern of the adhesive in the subsequently formed package can be controlled by controlling the dispense pattern and/or the volume of adhesive dispensed and/or by forming a recess in a lid. In step 86, a recess, such as recess (es) 40, is optionally formed in a lid, such as lid 34, using, for example, a punching process, another mechanical, chemical, or laser ablation process, or the like. The recess can be any of the recesses previously discussed or the like. In step 88, the lid is applied to the top surface of the chip and/or molding compound, for example, by using a pick-and-place tool to attach the lid to the adhesive. A gap may be formed between the molding compound and the lid where the adhesive does not cover a portion of a region between the molding compound and the lid, as shown in the examples above.

Figure 15:
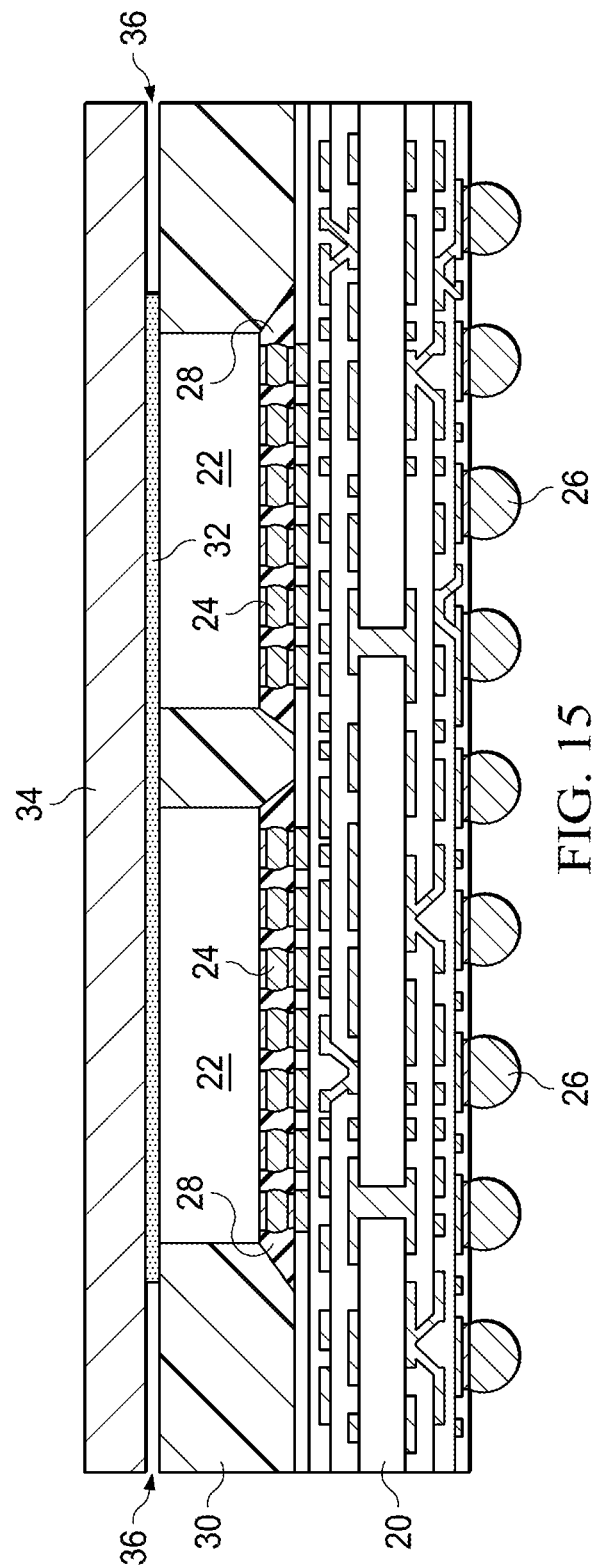
FIGS. 15 through 20 are other packages according to embodiments.
Figure 16:
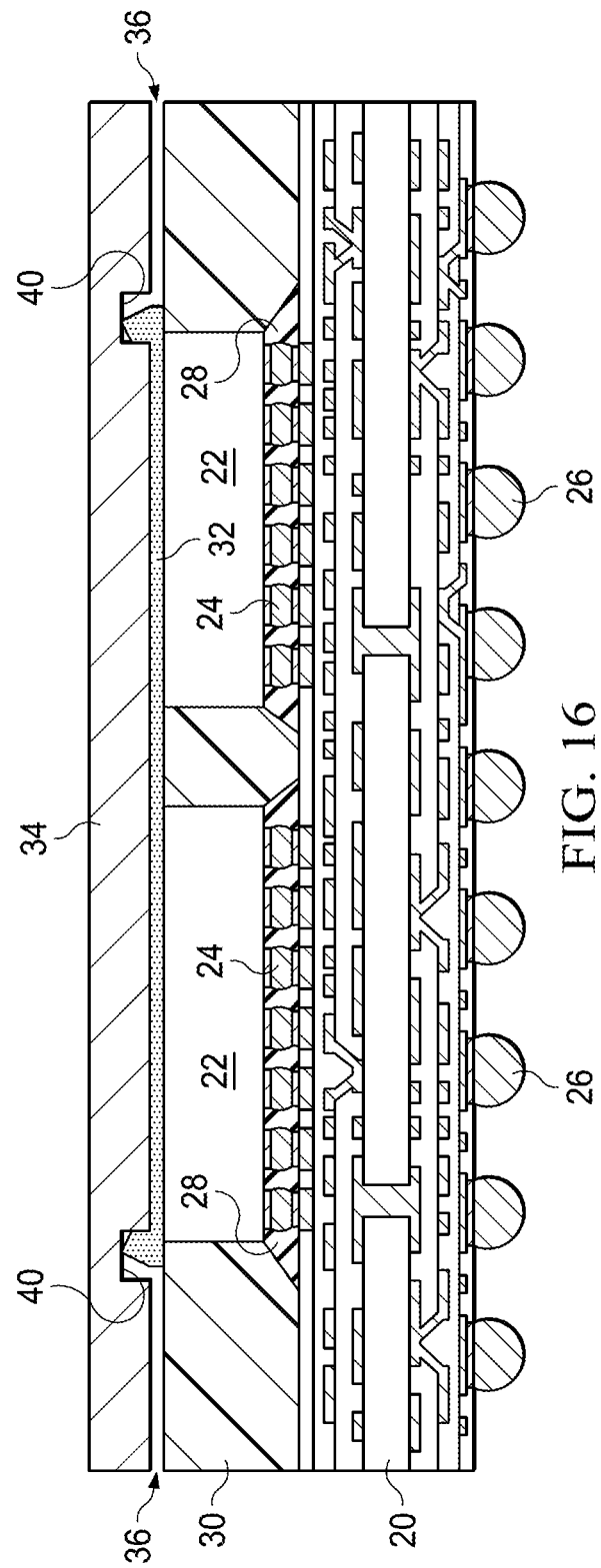

FIGS. 15 and 16 are other packages according to embodiments. The package of FIG. 15 is similar to the package in FIG. 1, and comprises two chips 22 connected to the substrate 20 by electrical connectors 24. FIG. 16 is similar to the package in FIG. 6, and comprises two chips 22 connected to the substrate 20 by electrical connectors 24. Other embodiments contemplate any number of chips configured in any manner, such as stacked chips.

Figure 17:
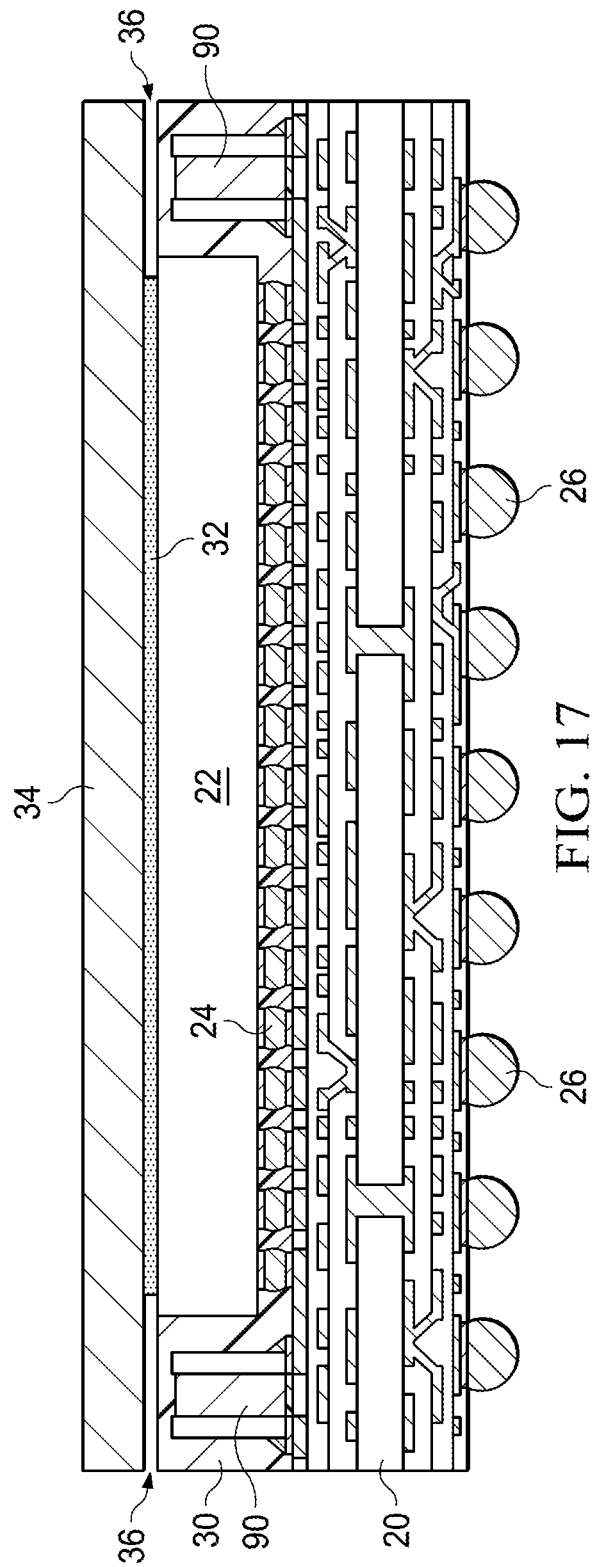
Figure 18:
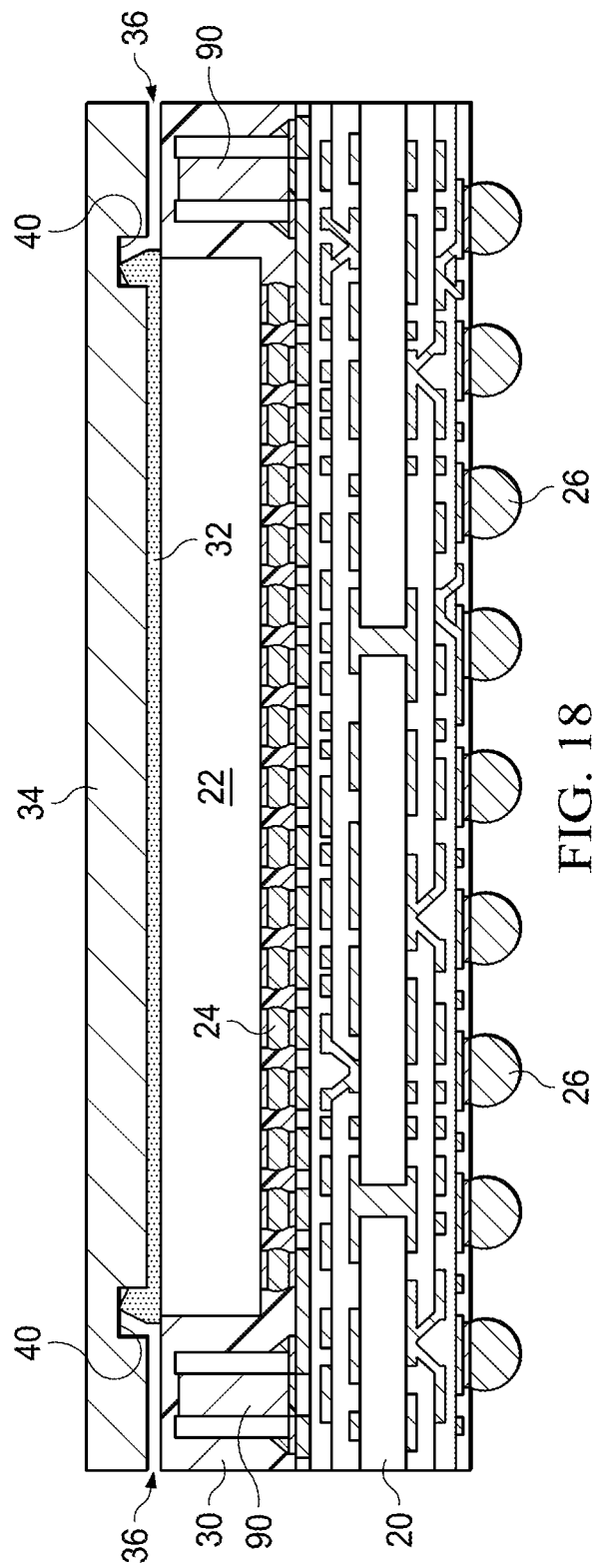
Figure 19:
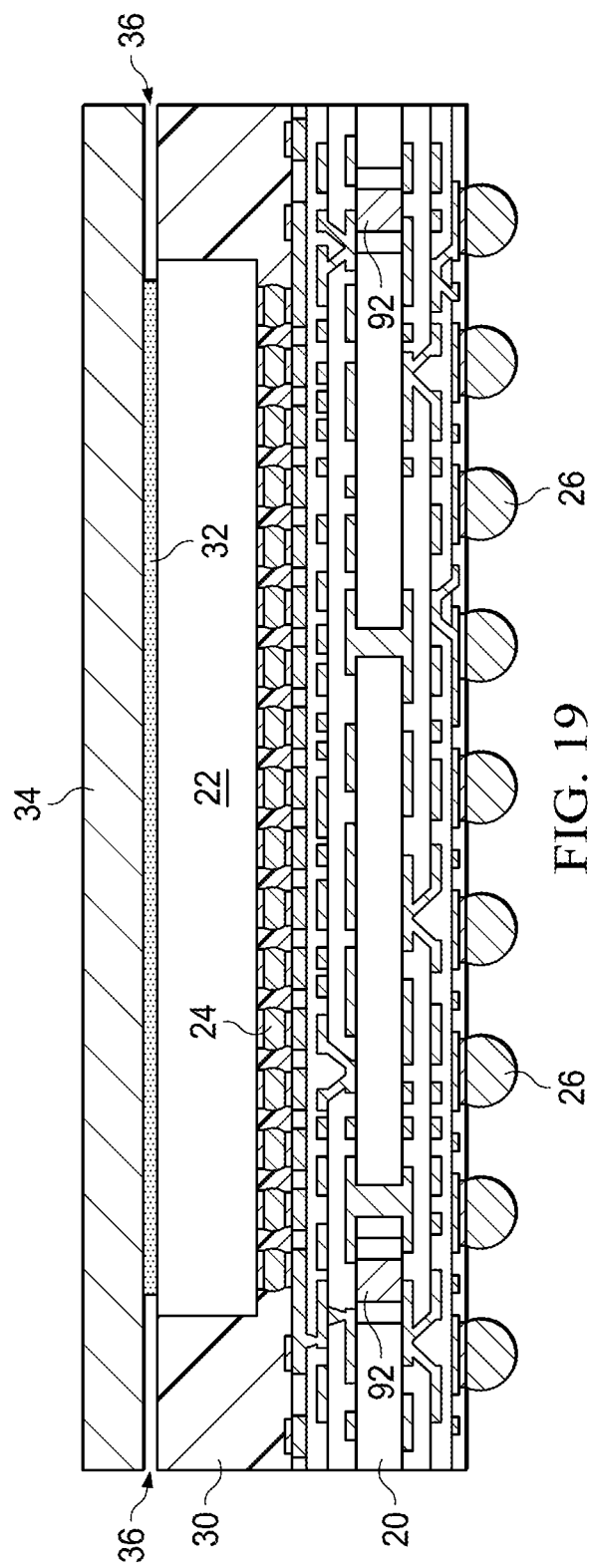
Figure 20:
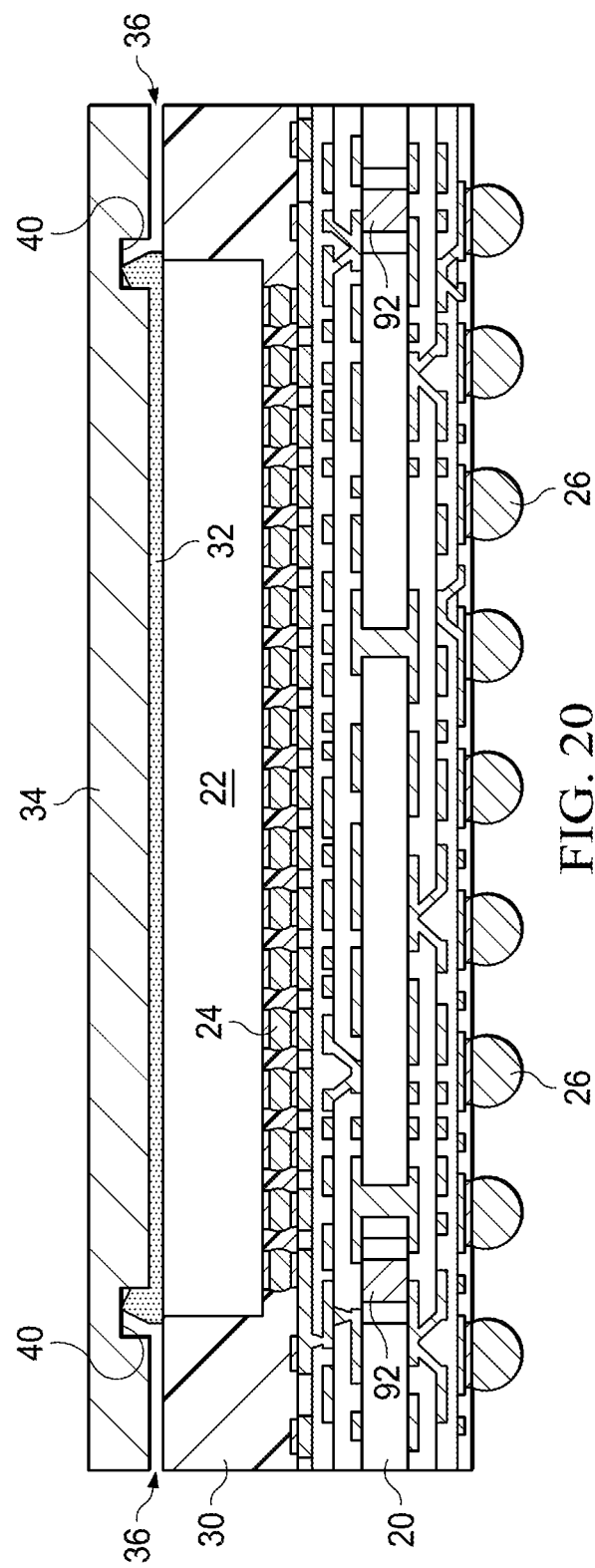

FIGS. 17 through 20 are further packages according to embodiments. The respective packages of FIGS. 17 and 19 are similar to the package in FIG. 1, and the respective packages of FIGS. 18 and 20 are similar to the package in FIG. 6. The packages in FIGS. 17 and 18 each comprise two passive devices 90, such as capacitors, inductors, or the like, in the molding compound 30. The packages in FIGS. 19 and 20 each comprise two passive devices 92, such as capacitors, inductors, or the like, in a core of the substrate 20. A person having ordinary skill in the art will readily understand how the passive devices 90 and 92 may be formed in the molding compound 30 and substrate 20, respectively, and thus, explicit discussion is omitted herein for brevity.

An embodiment is a package. The package comprises a substrate, a chip electrically and mechanically attached to a surface of the substrate with electrical connectors, a molding compound on the surface of the substrate and around the chip, an adhesive on a surface of the chip that is distal from the surface of the substrate, and a lid on the adhesive. A surface of the molding compound is co-planar with the surface of the chip. A region between the molding compound and the lid at a corner of the lid is free from the adhesive. The corner of the lid is in a first plane parallel to the surface of the molding compound. The region is defined in a direction in a second plane parallel to the surface of the molding compound by a minimum distance from the corner. The minimum distance is at least 5 percent of a distance from an exterior edge of the surface of the molding compound to a corresponding exterior edge of the surface of the chip.

Another embodiment is a package. The package comprises a substrate, a chip electrically and mechanically attached to a surface of the substrate with electrical connectors, a molding compound on the surface of the substrate and around the chip, an adhesive on a surface of the chip that is distal from the surface of the substrate, and a lid on the adhesive. The surface of the molding compound is co-planar with the surface of the chip. The lid has a recess in a surface of the lid facing the surface of the molding compound.

A further embodiment is a method. The method comprises attaching a chip to a surface of a substrate; forming a molding compound on the surface of the substrate and around the chip, a surface of the chip being co-planar with a surface of the molding compound; applying an adhesive to at least the surface of the chip; and attaching a lid to the adhesive, the lid having a recess, at least a portion of the adhesive being in the recess.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package comprising:
   a substrate;
   a chip electrically and mechanically attached to a surface of the substrate with electrical connectors;
   a molding compound on the surface of the substrate and around the chip, a surface of the molding compound being co-planar with a surface of the chip that is distal from the surface of the substrate;
   an adhesive on the surface of the chip; and
   a lid on the adhesive, a region between the molding compound and the lid at a corner of the lid being free from the adhesive, the corner of the lid being in a first plane parallel to the surface of the molding compound, the region being defined in a direction in a second plane parallel to the surface of the molding compound by a minimum distance from the corner, the minimum distance being at least 5 percent of a distance from an exterior edge of the surface of the molding compound to a corresponding exterior edge of the surface of the chip.

2. The package of claim 1, wherein a respective region is between the molding compound and the lid at each respective corner of the lid, each respective region being free from adhesive and defined in a respective direction in the second plane parallel to the surface of the molding compound by the minimum distance from the respective corner.

3. The package of claim 1, wherein the adhesive is on a portion of the surface of the molding compound.

4. The package of claim 1, wherein outer boundaries of the adhesive in a plane parallel to the surface of the chip is rectangular, circular, or a dodecagon.

5. The package of claim 1, wherein the lid has a recess, the recess being in a surface of the lid facing the surface of the molding compound, an edge of the recess being proximate to the region defined by the minimum distance from the corner.

6. The package of claim 5, wherein the recess comprises a trench recess having an edge aligned perpendicular to an axis extending from the corner of the lid to a closest corner of the surface of the chip.

7. The package of claim 5, wherein the recess comprises a single recess circumscribing the surface of the chip.

8. The package of claim 5, wherein the recess comprises a plurality of discrete recesses aligned perpendicular to an axis extending from the corner of the lid to a closest corner of the surface of the chip.

9. The package of claim 5, wherein the recess comprises a plurality of discrete recesses circumscribing the surface of the chip.

10. A package comprising:
a substrate;
a chip electrically and mechanically attached to a surface of the substrate with electrical connectors;
a molding compound on the surface of the substrate and around the chip, a surface of the molding compound being co-planar with a surface of the chip that is distal from the surface of the substrate;
an adhesive on the surface of the chip; and
a lid on the adhesive, the lid having a recess in a surface of the lid facing the surface of the molding compound, an edge of the recess being no less than a minimum distance from a closest corner of the lid, the minimum distance being 5 percent of a distance from the closest corner to a corresponding corner of the chip.

11. The package of claim 10, wherein the adhesive at least partially fills the recess.

12. The package of claim 10, wherein the edge of the recess is at least 300 μm from the closest corner of the lid.

13. The package of claim 10, wherein a region between the edge of the recess and the closest corner of the lid and between the surface of the lid and the surface of the molding compound is free from the adhesive.

14. The package of claim 10, wherein the recess is a trench recess aligned perpendicular to an axis extending between the corresponding corner of the chip and the closest corner of the lid.

15. The package of claim 10, wherein the recess comprises a plurality of discrete recesses aligned perpendicular to an axis extending between the corresponding corner of the chip and the closest corner of the lid.

16. The package of claim 10, wherein the recess circumscribes outer boundaries of the surface of the chip.

17. The package of claim 10, wherein the recess comprises a plurality of discrete recesses circumscribing outer boundaries of the surface of the chip.

18. A method comprising:
attaching a chip to a surface of a substrate;
forming a molding compound on the surface of the substrate and around the chip, a surface of the chip being co-planar with a surface of the molding compound;
applying an adhesive to at least the surface of the chip; and
attaching a lid to the adhesive, the lid having a recess, at least a portion of the adhesive being in the recess, the recess being at least a minimum distance from a nearest corner of the lid, the minimum distance being 5 percent of a distance from the nearest corner to a corresponding corner of the surface of the chip.

19. The method of claim 18 further comprising forming the recess in the lid using a punching process.

20. The method of claim 18, wherein the recess is disposed laterally between the corresponding corner of the surface of the chip and the nearest corner of the lid.

* * * * *